US 7,034,275 B2

(12) United States Patent  (10) Patent No.: US 7,034,275 B2
Mizuno  (45) Date of Patent: Apr. 25, 2006

(54) PHOTODETECTOR FOR DETECTING A QUANTITY OF LIGHT USING A COUNTING CIRCUIT AND AN INTEGRATING CIRCUIT

(75) Inventor: Seiichiro Mizuno, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 280 days.

(21) Appl. No.: 10/471,737

(22) PCT Filed: Jul. 11, 2002

(86) PCT No.: PCT/JP02/07074

§ 371 (c)(1),
(2), (4) Date: Sep. 16, 2003

(87) PCT Pub. No.: WO03/006937

PCT Pub. Date: Jan. 23, 2003

(65) Prior Publication Data

US 2004/0118994 A1  Jun. 24, 2004

(30) Foreign Application Priority Data

Jul. 13, 2001  (JP) .............................. 2001-214261

(51) Int. Cl.
*H01J 40/14*  (2006.01)
(52) U.S. Cl. ................................. 250/214 R
(58) Field of Classification Search ............ 250/214 R, 250/214.1, 208.1, 208.2, 214 DC
See application file for complete search history.

(56) References Cited

U.S. PATENT DOCUMENTS 5,847,594 A * 12/1998 Mizuno ...................... 327/514
6,590,372 B1 * 7/2003 Wiles, Jr. .................... 323/316

FOREIGN PATENT DOCUMENTS

| JP | 59-152723 | 8/1984 |
| JP | 04-252518 | 9/1992 |
| JP | 05-215607 | 8/1993 |
| JP | 08-051362 | 2/1996 |
| JP | 09-51476 | 2/1997 |
| JP | 2001-141562 | 5/2001 |

* cited by examiner

*Primary Examiner*—Thanh X. Luu
(74) *Attorney, Agent, or Firm*—Drinker Biddle & Reath LLP

(57) ABSTRACT

A charge generated in response to the quantity of the incident light into the photodiodes PD is accumulated in an integrating capacitor of an integrating circuit 10, and a voltage $V_{10}$ in response to the quantity of the accumulated charge is outputted. The voltage $V_{10}$ is inputted into a comparison circuit 20 and is compared with a prescribed threshold voltage therein. When the inputted voltage reaches the threshold voltage, a saturation signal $F_1$ showing the same is outputted. A certain quantity of charge whose polarity is inverse to that of the charge accumulated in the integrating capacitor of the integrating circuit 10 is injected into the integrating n capacitor by the charge injecting circuit 30 on the basis of the saturation signal. The number of times of the voltage $V_{10}$, which is outputted from the integrating circuit 10, reaching the threshold voltage is counted by the counting circuit 40 on the basis of the saturation signal outputted from the comparison circuit 20, wherein a quantity of incident light is detected on the basis of the counted made by the counting circuit 40 and the output voltage value from the integrating circuit 10.

8 Claims, 7 Drawing Sheets

PHOTODETECTOR FOR DETECTING A QUANTITY OF LIGHT USING A COUNTING CIRCUIT AND AN INTEGRATING CIRCUIT

TECHNICAL FIELD

The present invention relates to a photoelectric detector for detecting a quantity of an incident light.

BACKGROUND ART

A photoelectric detector for detecting a quantity of an incident light volume has a photodiode for generating a charge response to the quantity of the incident light volume, and outputs electric signals in response to the quantity of charge outputted from the photodiode. Such a photoelectric detector is described in, for example, Japanese Unexamined Patent Publication No. Hei-5-21507. FIG. 7 is a configurational view of a prior art photoelectric detector described in the above-described patent publication.

In the prior art photoelectric detector, light is made incident into a photodiode 1, and a current is outputted from the photodiode 1. The current is inputted into an integrating circuit composed of an amplifier 3 and an integrating capacitor 4, and charge is accumulated in the integrating capacitor 4. On the other hand, the accumulated charge is dumped by a certain quantity per time by a series of opening and closing actions of respective switches in a dump circuit consisting of switches $S_1$, $S_2$ and a capacitor $C_d$. Also, an output signal $V_{out}$ from the above-described integrating circuit is compared with a prescribed signal $V_{threshold}$ by a comparison circuit 7. Where the former is greater than the latter, a series of opening and closing actions of the switches $S_1$ and $S_2$ of the dump circuit are carried out by an instruction from a logic circuit 6, wherein the charge accumulated in the integrating capacitor 4 of the integrating circuit is dumped only by a certain quantity.

And, the number of times of dumping actions per unit time is counted by a counting circuit 8. The counted value is outputted as a digital value that expresses the intensity of light made incident into the photodiode 1. That is, in the photoelectric detector, the A/D converting means is composed of the logic circuit 6 and counting circuit 8, etc.

DISCLOSURE OF THE INVENTION

In the above-described prior art photoelectric detector, the number of bits of the digital value outputted by photoelectric detection is small. The number of bits is increased by lengthening the period of time during which the counting circuit counts the number of times of dumping actions carried out by the dumping circuit. However, a long-termed counting period hinders high-speed photoelectric detection.

Therefore, it is an object of the invention to provide a photoelectric detector capable of executing photoelectric detection with a large number of bits in a short time.

A photoelectric detector according to the invention comprises: (1) a photodiode for generating a charge response to the quantity of the incident light, (2) an integrating circuit, having an integrating capacitor for accumulating charge outputted from the above-described photodiode, for outputting a voltage in response to the quantity of the charge accumulated in the integrating capacitor, (3) a comparison circuit for comparing the voltage with a prescribed threshold voltage by inputting the voltage outputted from the above-described integrating circuit and for outputting, when the voltage value reaches the threshold voltage, a saturation signal showing the same, (4) a charge injection circuit for injecting a certain charge quantity, whose polarity is inverse to that of the charge accumulated in the integrating capacitor of the integrating circuit, into the integrating capacitor on the basis of the saturation signal outputted from the comparison circuit, and (5) a counting circuit for counting the number of times of the voltage outputted from the integrating circuit reaching the threshold voltage on the basis of the saturation signal outputted from the comparison circuit, wherein a quantity of an incident light is detected on the basis of the value showing the number of times counted by the counting circuit and the voltage outputted from the integrating circuit.

In the above-described photoelectric detector, a charge generated in response to the quantity of the incident light into a photodiode is accumulated in the integrating capacitor of the integrating circuit, and a voltage value in response to the quantity of charge accumulated in the integrating capacitor is outputted from the integrating circuit. The voltage outputted from the integrating circuit is inputted into the comparison circuit, and the inputted voltage and a prescribed threshold voltage are compared with each other by the comparison circuit with respect to the sizes thereof, wherein when the inputted voltage reaches the threshold voltage, a saturation signal showing the same is outputted from the comparison circuit. On the basis of the saturation signal outputted from the comparison circuit, a certain quantity of charge whose polarity is inverse to that of the charge accumulated in the integrating capacitor of the integrating circuit is injected into the integrating capacitor by the charge injection circuit. Also, on the basis of the saturation signal outputted from the comparison circuit, the number of times of the voltage outputted from the integrating circuit reaching the threshold voltage is counted by the counting circuit. And, the photoelectric detector is able to detect the quantity of the incident light on the basis of the value showing the number of times counted by the counting circuit and the voltage outputted from the integrating circuit.

It is preferable that the photoelectric detector according to the invention is further provided with a P/S converting circuit into which the number of times counted by the counting circuit is inputted as a parallel digital value and which serially outputs the digital value. Also, it is preferable that the photoelectric detector according thereto is further provided with an S/P converting circuit into which a digital value serially outputted by the P/S converting circuit is inputted, and which converts the same to a parallel digital value and outputs it. In this case, the number of times counted by the counting circuit is inputted into the P/S converting circuit as a parallel digital value and serially outputted from the P/S converting circuit. And, the digital value serially outputted from the P/S converting circuit is inputted into the S/P converting circuit and parallelly outputted from the S/P converting circuit, wherein, for example, if the P/S converting circuit and S/P converting circuit exist on chips different from each other, the number of signals lines therebetween can be reduced.

It is preferable that the photoelectric detector according to the invention is further provided with an A/D converting circuit into which a voltage outputted from the integrating circuit is inputted, and which converts the same to a digital value in response to the voltage, and outputs the digital value. In this case, the voltage outputted from the integrating circuit is inputted into the A/D converting circuit, is converted to a digital value by the A/D converting circuit, and is outputted therefrom.

It is preferable that the photoelectric detector according to the invention is further provided with a V/I converting circuit into which a voltage outputted from the integrating circuit is inputted, and which converts the same into a current in response to the voltage and outputs the current value. In addition, it is preferable that the photoelectric detector is further provided with an A/D converting circuit into which the current outputted from the V/I converting circuit is inputted, and which converts the current to a digital value in response to the current and outputs the digital value. In this case, the voltage outputted from the integrating circuit is inputted into the V/I converting circuit, is converted to a current by the V/I converting circuit and outputted therefrom. And, the current outputted from the V/I converting circuit is inputted into the A/D converting circuit, is converted to a digital value by the A/D converting circuit and outputted therefrom. Thereby, noise immunity can be improved.

It is preferable that the photoelectric detector according to the invention is further provided with a signal line that transmits, by time-sharing, a voltage outputted from the integrating circuit and a serial digital value outputted from the P/S converting circuit. Or it is preferable that the photoelectric detector is provided with (1) a V/I converting circuit into which a voltage outputted from the integrating circuit is inputted and which converts the same to a current in response to the voltage and outputs the current, and (2) a signal line for transmitting, by time-sharing, a current outputted from the V/I converting circuit and a serial digital value outputted from the P/S converting circuit. In this case, since the serial digital value outputted from the P/S converting circuit and the voltage outputted from the integrating circuit (or the current outputted from the V/I converting circuit) are transmitted through a signal line by time-sharing, the number of signal lines therebetween can be reduced, and this is preferable in view of improving the degree of integration.

It is preferable that the photoelectric detector according to the invention is provided with one set of an integrating circuit, a comparison circuit, a charge injecting circuit and a counting circuit with respect to a plurality of photo diodes. Or, it is preferable that an integrating circuit, a comparison circuit, a charge-injecting circuit and a counting circuit are made into one set, and a single signal line is provided for a plurality of sets thereof. These cases are preferable in view of reducing the number of signal lines and improving the degree of integration.

BEST MODES FOR CARRYING OUT THE INVENTION

Hereinafter, a description is given of embodiments of the invention with reference to the accompanying drawings. Also, the same parts are given the same reference numbers in the description of the drawings, and overlapping description is omitted.

Figure 1:
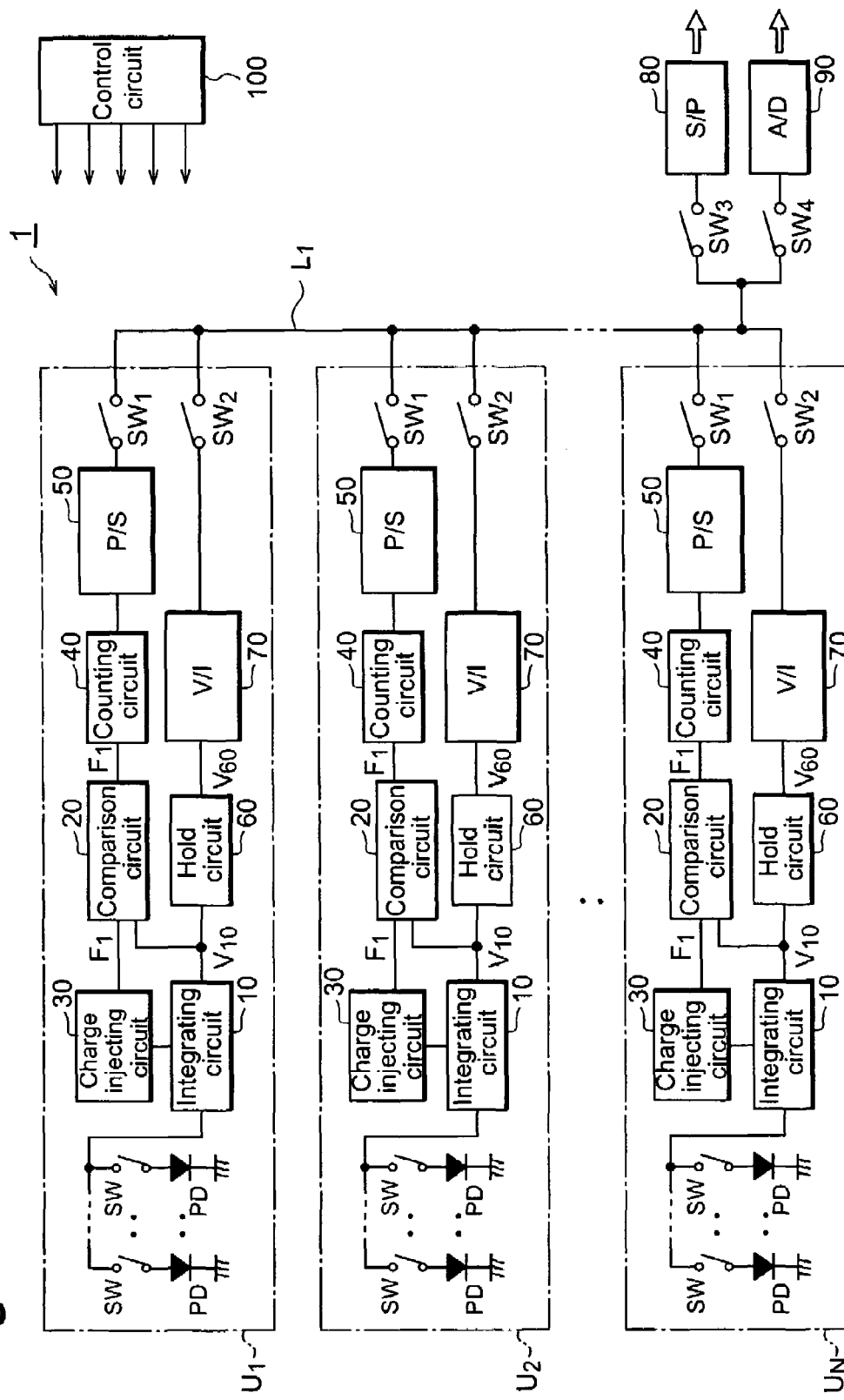
FIG. 1 is a configurational view of a photoelectric detector according to the present embodiment.

First, a description is given of embodiments of a photoelectric detector according to the invention. FIG. 1 is a configurational view of a photoelectric detector 1 according to the present embodiment. The photoelectric detector 1 is provided with "N" units $U_1$ through $U_N$ (N is an integer of 1 or more), an S/P converting circuit 80, an A/D converting circuit 90 and a control circuit 100. Also, the respective units $U_n$ (n is an optional integer of 1 or more but equal to or less than N) have the same configuration. The respective units $U_n$ are provided with one or more sets of a photodiode PD and a switch SW, an integrating circuit 10, a comparison circuit 20, a charge injecting circuit 30, a counting circuit 40, a P/S converting circuit 50, a sample hold circuit (hereinafter called a "hold circuit") 60, and a V/I converting circuit 70. The respective units $U_n$ are further provided with switches $SW_1$ and $SW_2$.

Figure 2:
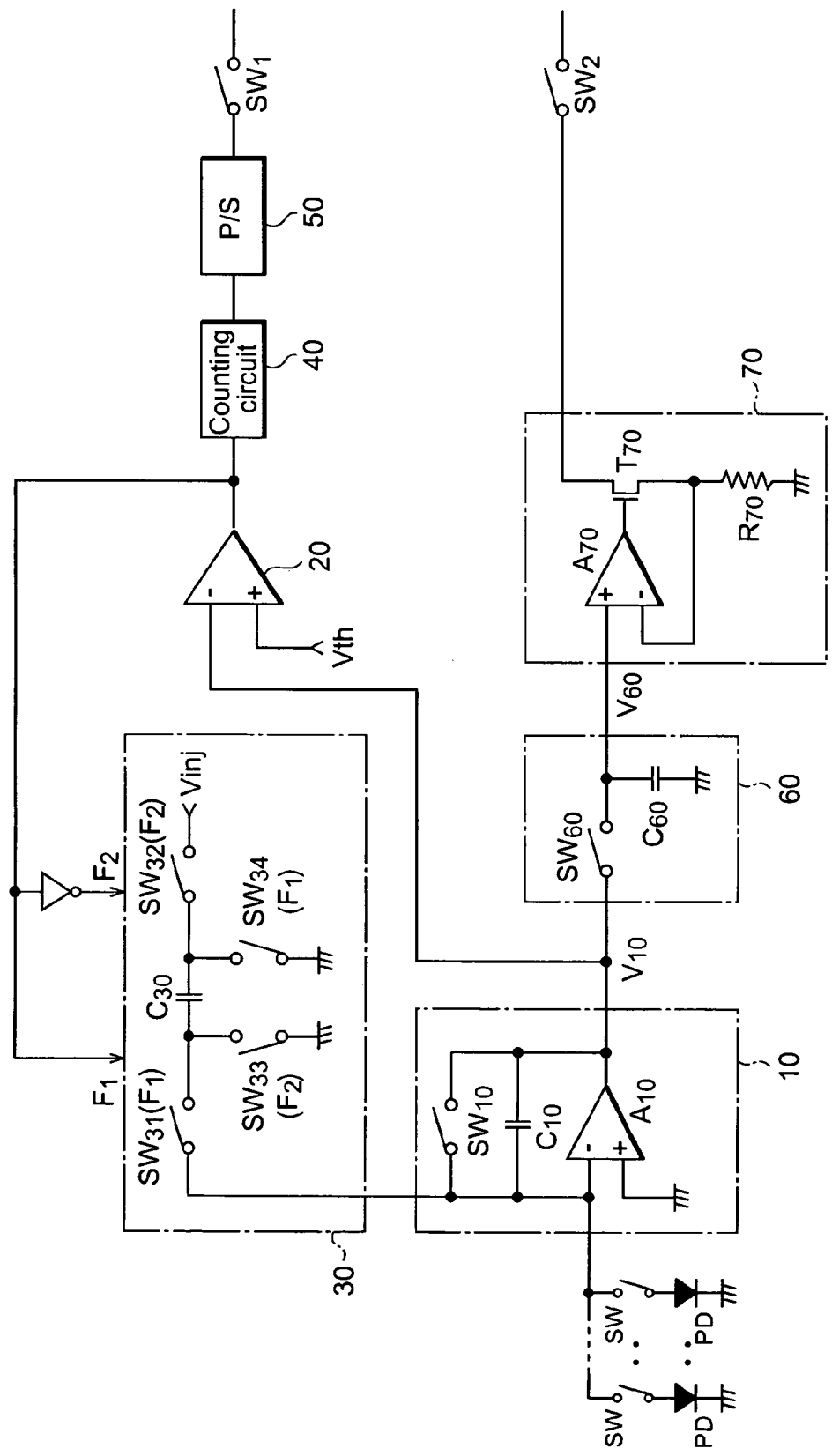
FIG. 2 is a circuit diagram of respective units $U_n$ of a photoelectric detector according to the embodiment.

FIG. 2 is a circuit diagram of respective units $U_n$ of a photoelectric detector 1 according to the embodiment. Cathode ports of respective photodiodes PD are grounded. Also, anode ports of the respective photodiodes PD are connected to the integrating circuit 10 via a switch SW. The respective photodiodes PD generate a charge in response to a quantity of an incident light.

The integrating circuit 10 is provided with an amplifier $A_{10}$, an integrating capacitor $C_{10}$ and a switch $SW_{10}$. A non-inverting input port of the amplifier $A_{10}$ is grounded. The integrating capacitor $C_{10}$ and switch $SW_{10}$ are connected in parallel between the non-inverting input port of the amplifier $A_{10}$ and output port thereof. When the switch $SW_{10}$ is closed, the integrating capacitor $C_{10}$ is discharged, wherein a reset level voltage is outputted from the integrating circuit 10. On the other hand, when the switch 10 is open, the charge outputted from the photodiode PD is accumulated in the integrating capacitor $C_{10}$, and voltage $V_{10}$ in response to the quantity of the charge accumulated in the integrating capacitor $C_{10}$ is outputted from the integrating circuit 10.

The voltage V outputted from the integrating circuit 10 is inputted into the comparison circuit 20, wherein the voltage V is compared with a prescribed threshold voltage $V_{th}$. When the voltage value V reaches the threshold voltage $V_{th}$, the comparison circuit 20 outputs a saturation signal $F_1$ showing that the voltage V reaches the threshold voltage $V_{th}$.

The charge injecting circuit 30 is provided with switches $SW_{31}$ through $SW_{34}$ and a capacitor $C_{30}$. The switches $SW_{31}$, capacitor $C_{30}$ and switch $SW_{32}$ are connected in series. The other end of the switch $SW_{31}$ is connected to the non-inverting input port of the amplifier $A_{10}$ of the integrating circuit 10. The other end of the switch $SW_{32}$ is connected to the reference voltage $V_{inj}$. The connection point between the switch $SW_{31}$ and capacitor $C_{30}$ is grounded via the switch $SW_{33}$. The connection point between the switch $SW_{32}$ and capacitor $C_{30}$ is grounded via the switch $SW_{34}$. The switches $SW_{31}$ and $SW_{34}$ are opened and closed on the basis of saturation signals $F_1$ outputted from the comparison circuit 20. The switches $SW_{32}$ and $SW_{33}$ are, respectively, opened and closed on the basis of inversion logic signals $F_2$ of the saturation signals $F_1$ outputted from the comparison circuit 20. That is, the charge injecting circuit 30 injects a certain quantity of charge, whose polarity is inverse to that of the charge accumulated in the integrating capacitor $C_{10}$ of the integrating circuit 10, in the integrating capacitor $C_{10}$ on the basis of the saturation signals $F_1$ outputted from the comparison circuit 20.

As the saturation signal $F_1$ outputted from the comparison circuit 20 is received, the counting circuit 40 counts, for a certain period of time, the number of times of the voltage V outputted from the integrating circuit 10 reaching the threshold voltage $V_{th}$, and outputs the counted number of times as a parallel digital value. The P/S converting circuit 50 receives, as an input, the parallel digital value outputted from the counting circuit 50, and serially outputs it.

The hold circuit 60 has a switch $SW_{60}$ and a capacitor $C_{60}$. The switch $SW_{60}$ is provided between the input port and output port of the hold circuit 60, and the output port of the hold circuit 60 is grounded through the capacitor $C_{60}$. The hold circuit 60 holds the voltage $V_{10}$ outputted from the integration circuit 10 by the capacitor $C_{60}$ when the switch $SW_{60}$ is closed, and after the switch $SW_{60}$ is opened, holds, by the capacitor $C_{60}$, the voltage $V_{10}$ immediately before the switch $SW_{60}$ is opened. And, the hold circuit 60 outputs the held voltage $V_{60}$.

The V/I converting circuit 70 is provided with an amplifier $A_{70}$, an electric field effect transistor $T_{70}$ (hereinafter called a "transistor $T_{70}$"), and a resistor $R_{70}$. The non-inverting input port of the amplifier $A_{70}$ is connected to the output port of the hold circuit 60. The inverting input port of the amplifier $A_{70}$ is connected to the drain port of the transistor $T_{10}$. The output port of the amplifier $A_{70}$ is connected to the gate terminal of the transistor $T_{70}$. The drain port of the transistor $T_{70}$ is grounded through the resistor $R_{70}$. The V/I converting circuit 70 receives the voltage $V_{60}$, which is outputted by the integrating circuit 10 and held by the hold circuit 60, as an input, converts it to a current in response to the voltage $V_{60}$, and outputs the current through a source port of the transistor $T_{70}$.

As shown in FIG. 1, the switch $SW_1$ is provided between the P/S converting circuit 50 and the signal line $L_1$. Also, the switch $SW_2$ is provided between the V/I converting circuit 70 and the signal line $L_1$. That is, the P/S converting circuit 50 of the respective units $U_n$ and V/I converting circuit thereof are, respectively, connected to a common signal line $L_1$ via the switches $SW_1$ and $SW_2$. Since the switches $SW_1$ and $SW_2$ of the respective units $U_n$ are closed one after another, the signal line $L_1$ transmits, by time-sharing, the current outputted from the V/I converting circuit 70 of the respective units $U_n$, and a serial digital value outputted from the P/S converting circuit 50 of the respective units $U_n$.

The S/P converting circuit 80 is connected to the signal line $L_1$ via the switch $SW_3$. The S/P converting circuit 80 receives a digital value serially outputted from the P/S converting circuit 50 of the respective units $U_n$ one after another as an input, and converts the same to a parallel digital value and outputs it.

The A/D converting circuit 90 is connected to the signal line $L_1$ via the switch $SW_4$. The A/D converting circuit 90 receives the current outputted from the V/I converting circuit 70 of the respective units $U_n$ as an input, converts the same to a digital value in response to the current, and outputs the digital value.

The control circuit 100 controls the entire operation of the photoelectric detector 1. In detail, the control circuit controls the operations from a) through i) described below.

a) Opening and closing actions of the switches SW provided corresponding to the respective photodiodes b) Opening and closing actions of the switch $SW_{10}$ in the integrating circuit 10 c) Opening and closing actions of the respective switches $SW_{31}$ through $SW_{34}$ in the charge injecting circuit 30 d) Counting action of the counting circuit 40 e) Converting action in the P/S converting circuit 50 f) Opening and closing actions of the switch $SW_{60}$ in the hold circuit 60 g) Opening and closing actions of the switches $SW_1$ through $SW_4$ h) Converting action in the S/P converting circuit 80 i) Converting action in the A/D converting circuit 90

Figure 3:
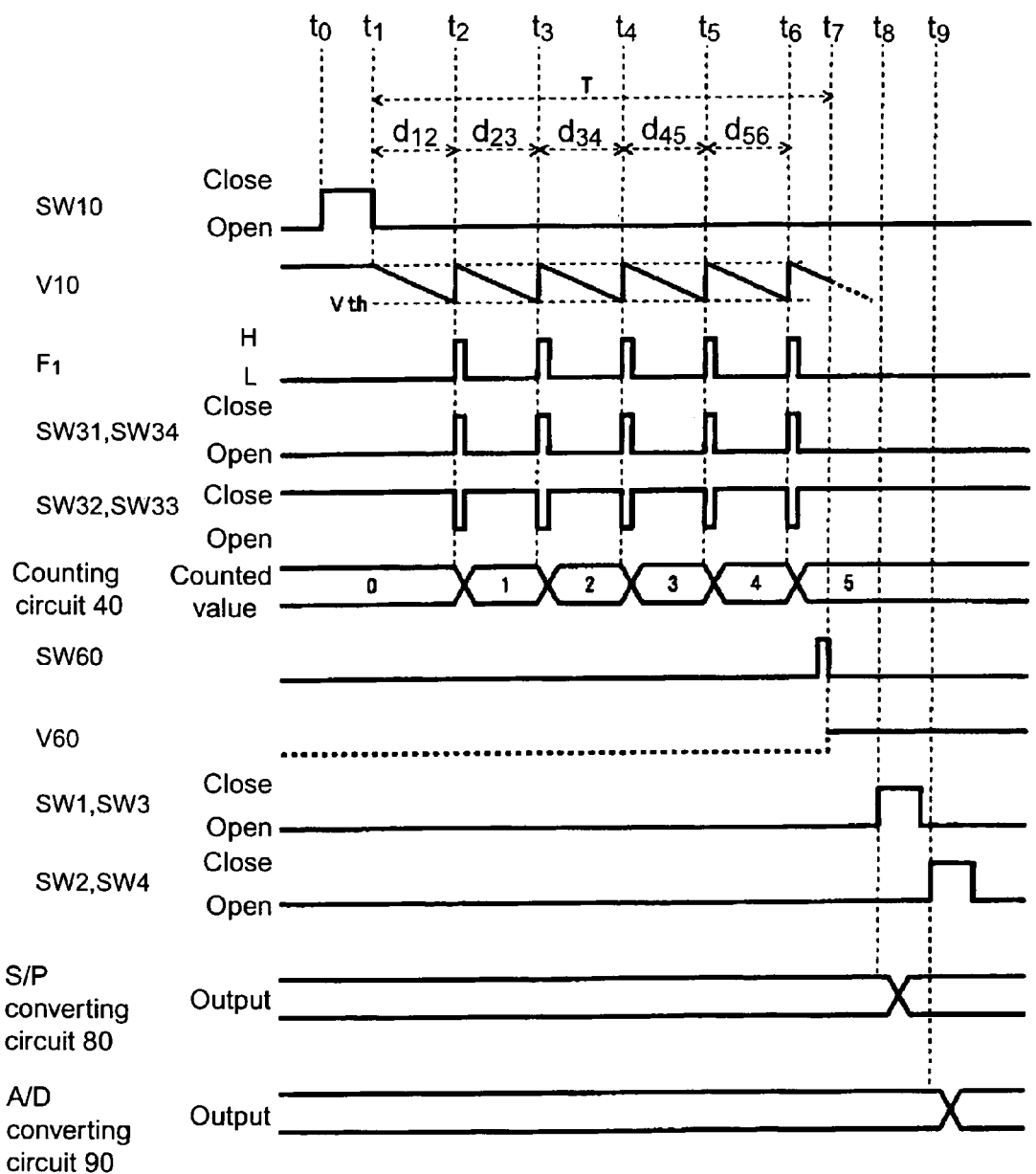
FIG. 3 is a timing chart describing actions of the photoelectric detector according to the embodiment.

Next, a description is given of actions of the photoelectric detector 1 according to the embodiment. Actions described below are carried out on the basis of controls made by the control circuit 100. FIG. 3 is a timing chart describing actions of the photoelectric detector 1 according to the embodiment.

Prior to time $t_0$, the saturation signal $F_1$ outputted from the comparison circuit 20 is maintained on the logic level L. Also, prior to time $t_0$, the switches $SW_{31}$ and $SW_{34}$ of the charge injecting circuit 30 are, respectively, opened, and the switches $SW_{32}$ and $SW_{33}$ of the charge injecting circuit 30 are, respectively, closed. In addition, the counted value of the counting circuit 40 is initialized at value 0. When the switch $SW_{10}$ of the integrating circuit 10 is closed at time $t_0$, the integrating capacitor $C_{10}$ is discharged. Therefore, the voltage $V_{10}$ outputted from the integrating circuit 10 is reset.

When the switch $SW_{10}$ of the integrating circuit 10 is opened at time $t_1$, a charge generated by the photodiode PD is gradually accumulated in the integrating capacitor $C_{10}$, and the voltage $V_{10}$ is outputted from the integrating circuit 10 in response to the quantity of the accumulated charge. The voltage $V_{10}$ outputted from the integration circuit 10 is compared with the threshold voltage $V_{th}$ by the comparison circuit 20.

As the voltage $V_{10}$ outputted from the integrating circuit 10 reaches the threshold voltage $V_{th}$ at time $t_2$, the saturation signal $F_1$ outputted from the comparison circuit 20 is converted from logic level L to logic level H. In line with the conversion, the switches $SW_{31}$ and $SW_{34}$ of the charge injecting circuit 30 are respectively closed, and the switches $SW_{32}$ and $SW_{33}$ are respectively opened. If the quantity of charge $Q_{10}$ ($=C_{10} \cdot V_{th}$) accumulated in the integrating capacitor $C_{10}$ when the voltage value $V_{10}$ outputted from the integration circuit 10 is equal to the quantity of charge $Q_{30}$ ($=C_{30} \cdot V_{inj}$) accumulated in the capacitor $C_{30}$ of the charge injecting circuit 30 before that time, the charge accumulated in the capacitance element $C_{30}$ is injected into the integrating capacitor $C_{10}$. Therefore, the quantity of charge accumulated in the integrating capacitor $C_{10}$ is reset. Accordingly, the voltage $V_{10}$ outputted from the integration circuit 10 is once entered into a reset level. The voltage $V_{10}$ in response to the quantity of charge accumulated thereafter is outputted from the integrating circuit 10. Also, the saturation signal $F_1$ immediately outputted from the comparison circuit 20 is converted to logic level L. In line with the conversion, the switches $SW_{31}$ and $SW_{34}$ of the charge injecting circuit 30 are respectively opened, and switches $SW_{32}$ and $SW_{33}$ are respectively closed.

At times $t_3$, $t_4$, $t_5$, and $t_6$, a series of the above-described actions at time $t_2$ are carried out. Herein, the period $d_{12}$ from time $t_1$ to time $t_2$, period $d_{23}$ from time $t_2$ to time $t_3$, period $d_{34}$ from time $t_3$ to time $t_4$, period $d_{45}$ from time $t_4$ to time $t_5$, and period $d_{56}$ from time $t_5$ to time $t_6$ are respectively equal to each other if the quantity of the incident light into the photodiode PD in these periods are fixed. Such repeated actions are executed from time $t_1$, at which an integrating action is commenced in the integrating circuit 10, to time $t_7$ (=$t_1$+T) at which a fixed duration T of time elapses from time $t_6$. The period from time $t_6$ to time $t_7$ is shorter than the above-described period $d_{12}$, etc. The number of times of the saturation signal $F_1$, which is outputted from the comparison circuit 20, being turned from logic level L to logic level H in the fixed duration T of time is counted by the counting circuit 40. That is, the counted value in the counting circuit 40 becomes a value 1 at time $t_2$, value 2 at time $t_3$, value 3 at time $t_4$, value 4 at time $t_5$, and value 5 at time $t_6$. That is, an A/D converting function can be brought about by the comparison circuit 20 and counting circuit 40.

The switch $SW_{60}$ of the hold circuit 60 is closed before time $t_7$, and the switch $SW_{60}$ is opened at time $t_7$. As a result, voltage $V_{60}$ that are outputted from the hold circuit 60 after time $t_7$ become equal to the voltage $V_{10}$ that has been outputted from the integrating circuit 10 immediately before time $t_7$. Voltage $V_{60}$ that will be outputted from the hold circuit 60 after time $t_7$ are inputted into the V/I converting circuit 70. The voltage $V_{60}$ inputted from the hold circuit 60 are converted to current values in the V/I converting circuit 70. The current are outputted from the source port of the transistor $T_{70}$. Also, the counting action in the counting circuit 40 comes to a stop at time $t_7$. After time $t_7$, the counted value at the time is maintained by the counting circuit 40 and is outputted to the P/S converting circuit 50.

Only for a certain period of time from time $t_8$, are the switches $SW_1$ and $SW_3$ respectively closed. In the certain period of time, counted values (digital values) outputted from the counting circuit 40 are serially outputted from the P/S converting circuit 50, inputted into the S/P converting circuit 80 through the switch $SW_1$, signal line $L_1$ and switch $SW_3$ in order, and are parallelly outputted from the S/P converting circuit 80.

Also, only for a certain period of time from time $t_9$ after the switches $SW_1$ and $SW_3$ are respectively opened, switches $SW_2$ and $SW_4$ are respectively closed. In the certain period of time, a current (analog) outputted from the V/I converting circuit 70 is inputted into the A/D converting circuit 90 via the switch $SW_2$, signal line $L_1$ and switch $SW_4$ in order, converted to a digital value by the A/D converting circuit 90 and is then outputted.

The above-described actions are carried out with respect to each of one or a plurality of photodiodes PD that are included in the respective units $U_n$. As described above, the first digital value that is outputted from the S/P converting circuit 80 and the second digital value that is outputted from the A/D converting circuit 90 are obtained as output values with respect to the quantity of the incident light into the respective photodiodes PD. As has been made clear from the above-described actions, the second digital value is less significant than the first digital value. Where it is assumed that the first digital value is expressed by M1 bit and the second digital value is expressed by M2 bit, as for the digital values outputted from the photoelectric detector 1, bit numbers are expressed by a progression of (M1+M2): $B_{M1+M2-1}$, $B_{M1+M2-2}$, $B_{M1+M2-3}$ ... $B_{M2}$, $B_{M2-1}$ ... $B_2$, $B_1$, $B_0$. Data from $B_{M1+M2-1}$ to $B_{M2}$ of the more significant M1 bits correspond to the first digital values, and data from $B_{M2-1}$ to $B_0$ of the less significant M2 bits correspond to the second digital values.

Therefore, in the photoelectric detector 1 according to the present embodiment, the quantity of the incident light into the photodiode PD is converted to the first digital value by the above mentioned A/D converting function that is achieved by the comparison circuit 20 and counting circuit 40, and the remainder thereof, which is not analog-digitally converted by the A/D converting function, is converted to the second digital value by the A/D converting circuit 90. Therefore, the photoelectric detector 1 is capable of detecting a quantity of an incident light with a large number of bits in a short time. Also, since, in the photoelectric detector 1, a plurality of photodiodes PD are one-dimensionally or two-dimensionally arrayed, an incident light image can be picked up with a large number of bits.

Also, in the photoelectric detector 1, a single signal line $L_1$ is provided between the S/P converting circuit 80 and A/D converting circuit 90, and the respective units $U_n$. Serial digital values outputted from the P/S converting circuit 50 and currents outputted from the V/I converting circuit 70 are transmitted through the signal line $L_1$ by time-sharing. For this reason, the number of signal lines can be reduced between the circuits. Such a configuration is preferable in view of improving the degree of integration. In addition, since one set of an integrating circuit 10, a comparison circuit 20, a charge injecting circuit 30 and a counting circuit 40 is provided for a plurality of photodiodes PD, the degree of integration can be improved. Also, since the integrating circuit 10, comparison circuit 20, charge injecting circuit 30 and counting circuit 40 are constructed as one set, and only a single signal line $L_1$ is provided for a plurality of sets thereof, the number of signal lines $L_1$ can be reduced therebetween. Such a configuration is also preferable in view of improving the degree of integration.

Figure 4:
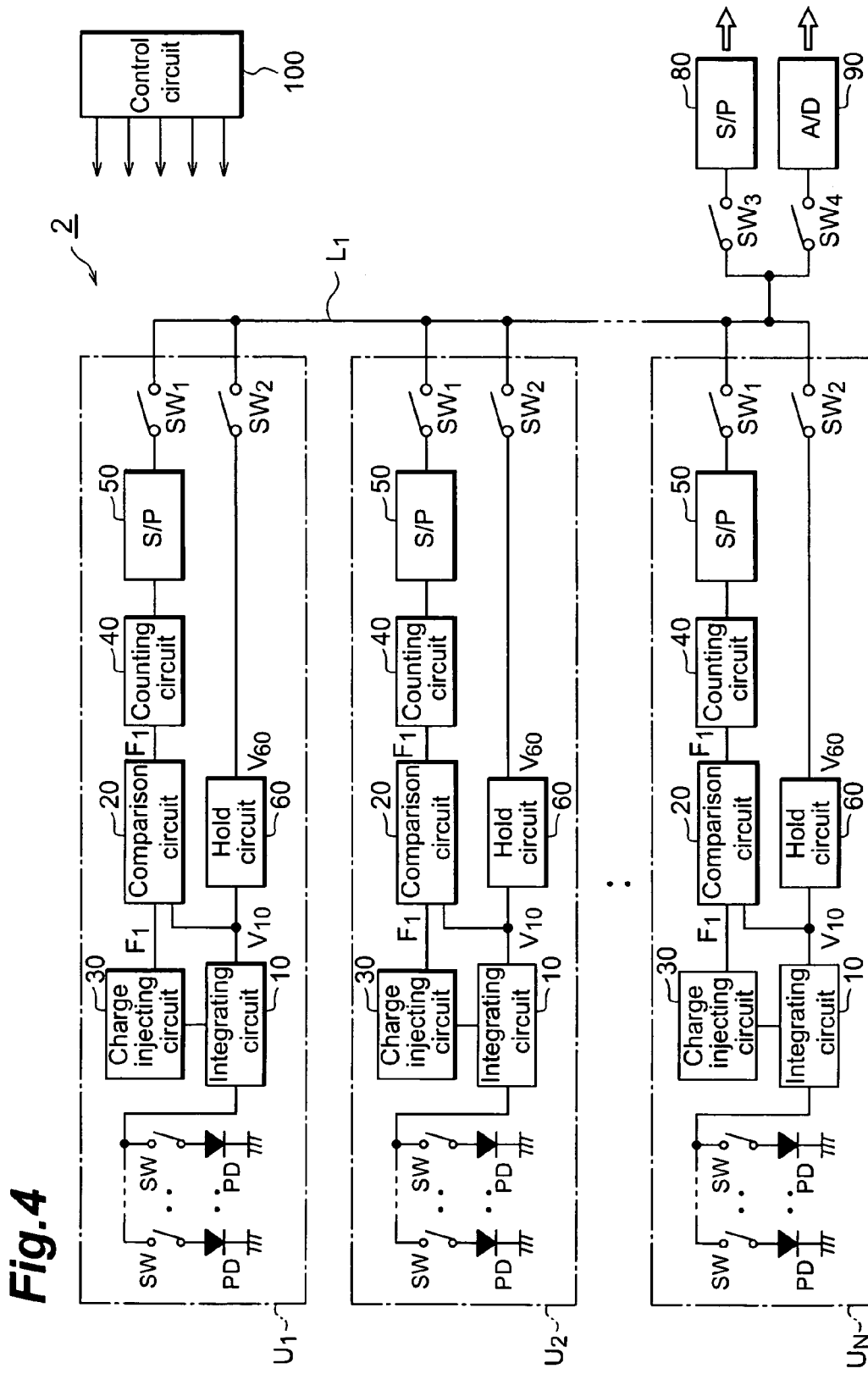
FIG. 4 is a configurational view of a photoelectric detector according to another embodiment.

Next, a description is given of another embodiment of a photoelectric detector according to the invention. If a photoelectric detector 2 according to another embodiment, which is shown in FIG. 4, is compared with the photoelectric detector 1 shown in FIG. 1, the former is different from the latter in that the photoelectric detector 2 is not provided with the V/I converting circuit 70 and the A/D converting circuit 90 receives a voltage as an input and analog-digitally converts the same. In the photoelectric detector 2, a voltage $V_{60}$ outputted from the hold circuit 60 in the respective units $U_n$ is inputted in the A/D converting circuit 90 via the switch $SW_2$, signal line $L_1$ and switch $SW_4$ in order, and is outputted after being converted to a digital value by the A/D converting circuit 90. Except for this point, the photoelectric detector 2 is similar to the photoelectric detector 1, and carries out actions similar to those of the photoelectric detector 1. Then, the photoelectric detector 2 brings about effects similar to those of the photoelectric detector 1. In addition, the photoelectric detector 1 shown in FIG. 1 is further preferable in view of noise immunity.

Figure 5:
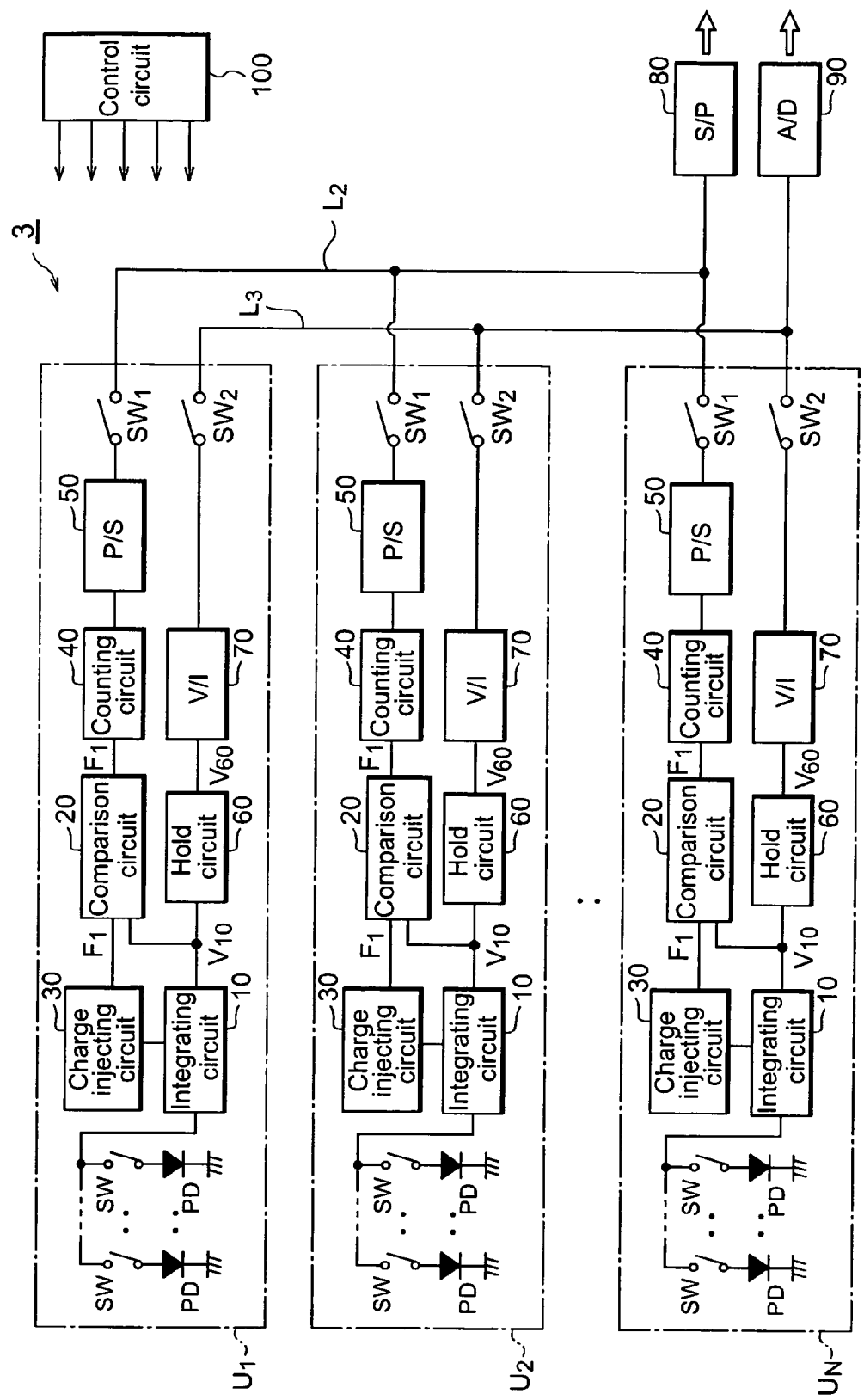
FIG. 5 is a configurational view of a photoelectric detector according to still another embodiment.

Since a photoelectric detector 3 according to still another embodiment, which is shown in FIG. 5, is compared with the photoelectric detector 1 shown in FIG. 1, the photoelectric detector 3 is different from the photoelectric detector 1 in that the switches $SW_3$ and $SW_4$ are not provided, and two signal lines $L_2$ and $L_3$ are provided instead of the signal line $L_1$. In the photoelectric detector 3, a serial digital value outputted from the P/S converting circuit 50 of the respective units $U_n$ is inputted into the S/P converting circuit 80 via the switch $SW_1$ and signal line $L_2$ in order and is parallelly outputted by the S/P converting circuit 80. Also, a voltage $V_{60}$ outputted from the V/I converting circuit 70 of the respective units $U_n$ is inputted into the A/D converting circuit 90 via the switch $SW_2$ and signal line $L_3$ and is outputted after being converted to a digital value by the A/D converting circuit 90. Except for this point, the photoelectric detector 3 has a configuration similar to that of the photoelectric detector 1, executes actions similar to those thereof, and brings about effects similar to those thereof. In view of reducing the number of signal lines, the photoelectric detector 1 shown in FIG. 1 is further preferable.

Figure 6:
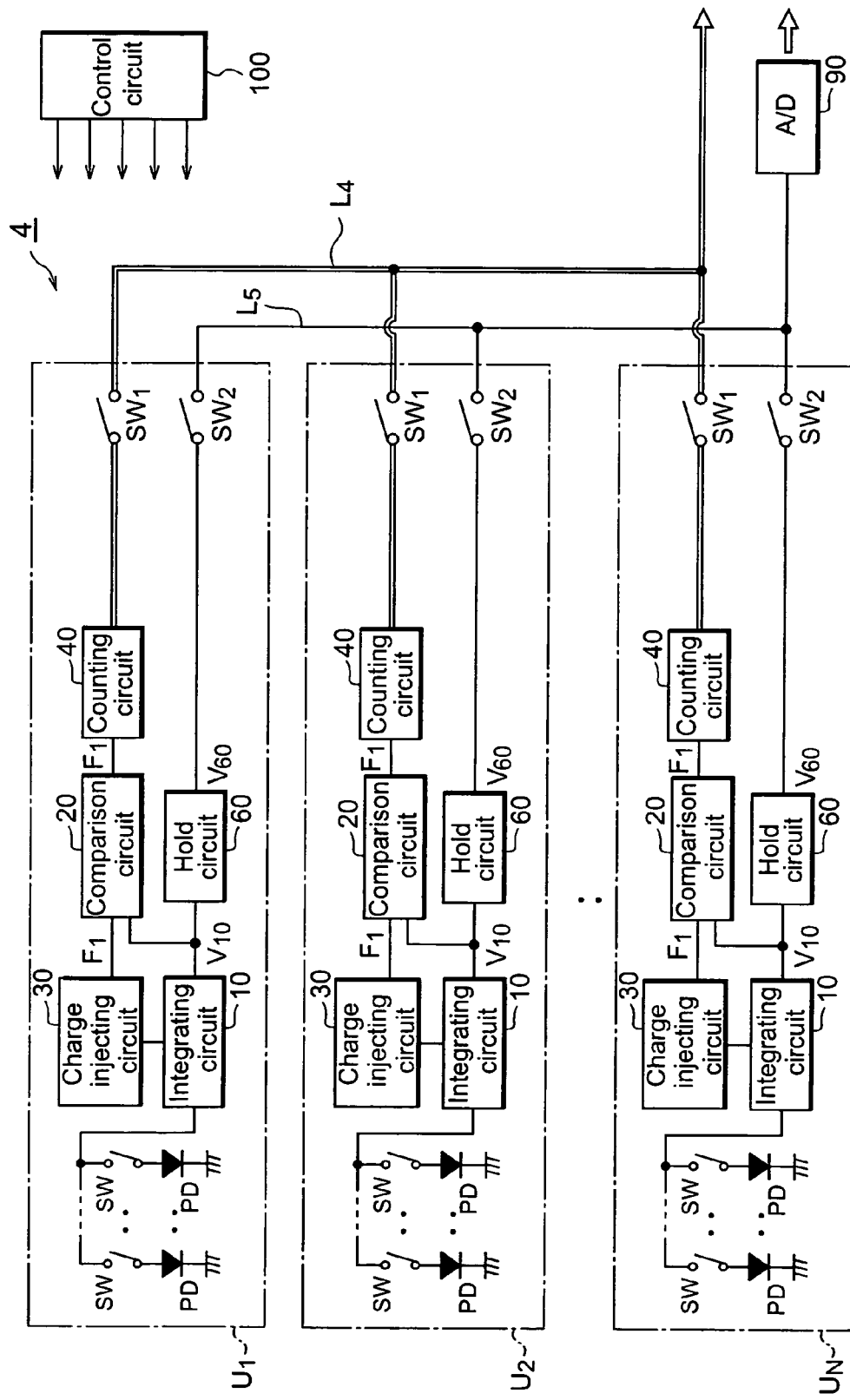
FIG. 6 is a configurational view of a photoelectric detector according to still another embodiment.
Figure 7:
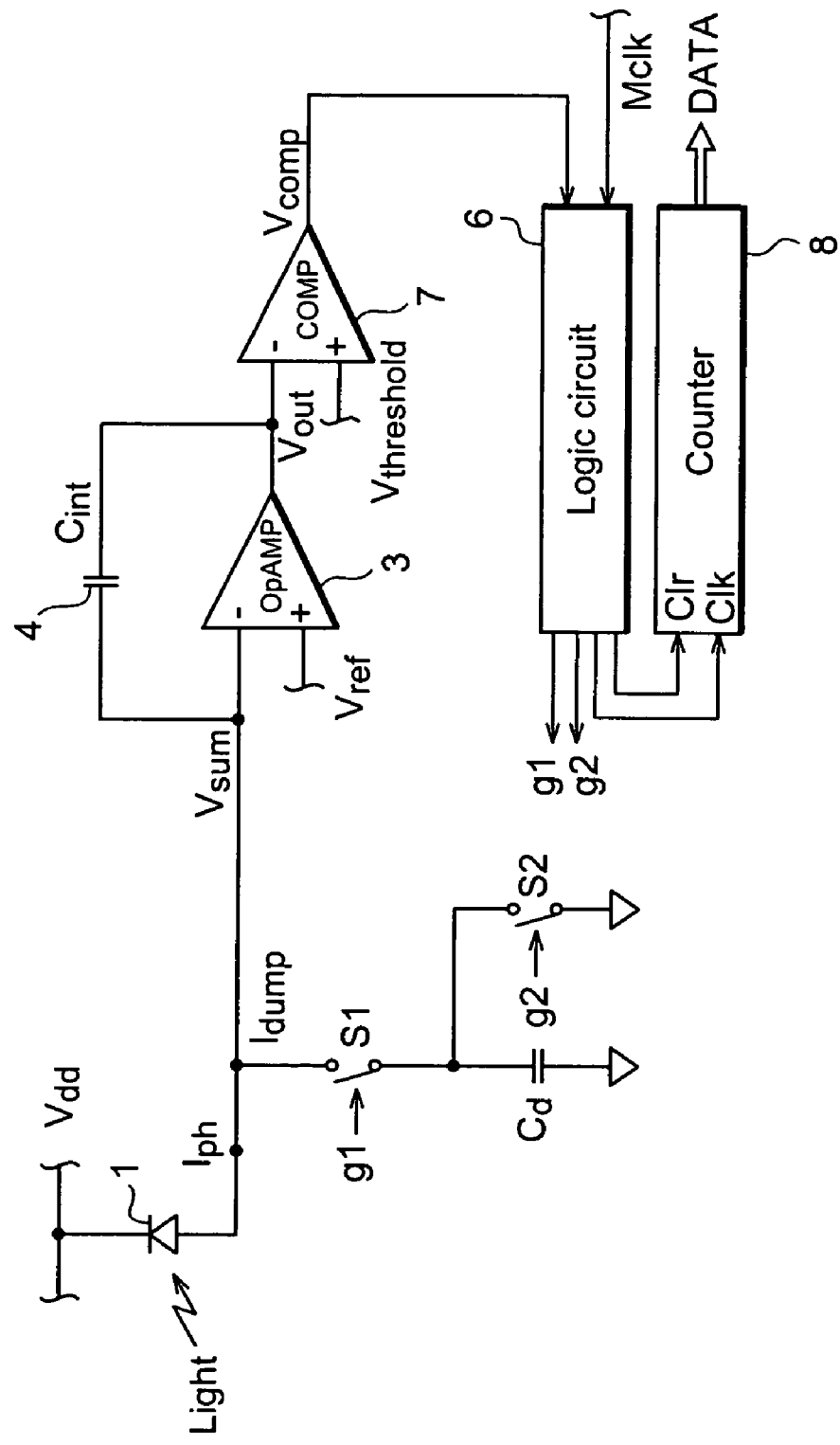
FIG. 7 is a configurational view of a prior art photoelectric detector.

Since a photoelectric detector 4 according to still another embodiment, which is shown in FIG. 6, is compared with the photoelectric detector 1 shown in FIG. 1, the photoelectric detector 4 is different from the photoelectric detector 1 in that the P/S converting circuit 50, V/I converting circuit 70 and S/P converting circuit 80 are not provided, the A/D converting circuit 90 receives a voltage value as an input and analog-digitally converts the same, the switches $SW_3$ and $SW_4$ are not provided, and two types of signal lines $L_4$ and $L_5$ are provided instead of the signal line $L_1$. In the photoelectric detector 4, a parallel digital outputted from the counting circuit 40 of the respective units $U_n$ is outputted, as it is, through the switch $SW_1$ and signal $L_4$ in order. In addition, a voltage $V_{60}$ outputted from the hold circuit 60 of the respective units $U_n$ is inputted into the A/D converting circuit 90 via the switch $SW_2$ and signal line L5 in order and is outputted after being converted to a digital value by the A/D converting circuit 90. Except for this point, the photoelectric detector 4 has a configuration similar to that of the photoelectric detector 1, executes actions similar to those thereof, and brings about effects similar to those thereof. In view of noise immunity and reduction in the number of signal lines, the photoelectric detector 1 shown in FIG. 1 is further preferable.

INDUSTRIAL APPLICABILITY

As has been described above in detail, according to the invention, a charge that is generated in response to the quantity of the incident light into a photodiode is accumulated in an integrating capacitor of an integrating circuit, and a voltage value in response to the quantity of the charge accumulated in the integrating capacitor is outputted from the integrating circuit. The voltage outputted from the integrating circuit is inputted into a comparison circuit, and the inputted voltage value is compared with a prescribed threshold voltage by the comparison circuit, wherein when the inputted voltage reaches the threshold voltage, a saturation signal showing this is outputted from the comparison circuit. A certain quantity of charge, whose polarity is inverse to that of the charge accumulated in the integrating capacitor of the integrating circuit, is injected into the integrating capacitor by the charge injecting circuit on the basis of the saturation signal outputted from the comparison circuit. In addition, the number of times of the voltage, which is outputted from the integrating circuit, reaching the threshold voltage is counted by the counting circuit on the basis of the saturation signal outputted from the comparison circuit. And, in the photoelectric detector, a quantity of an incident light is detected by the number of times counted by the counting circuit and the voltage outputted from the integrating circuit. Therefore, with the photoelectric detector, it is possible to detect the quantity of the incident light with a large number of bits in a short time.

The invention claimed is:

1. A photoelectric detector comprising:
   a photodiode for generating a charge in response to a quantity of an incident light;
   an integrating circuit, having an integrating capacitor for accumulating charge outputted from the photodiode, for outputting a voltage in response to the quantity of the charge accumulated in the integrating capacitor;
   a comparison circuit for comparing the voltage with a prescribed threshold voltage by inputting the voltage outputted from said integrating circuit and for outputting, when the voltage reaches the threshold voltage, a saturation signal showing the status of the saturation of this voltage;
   a charge injection circuit for injecting a certain quantity of charge, whose polarity is inverse to that of the charge accumulated in the integrating capacitor of the integrating circuit, into the integrating capacitor on the basis of the saturation signal outputted from the comparison circuit;
   a counting circuit for counting the number of times of the voltage outputted from the integrating circuit reaching the threshold voltage on the basis of the saturation signal outputted from the comparison circuit,
   wherein a quantity of an incident light is detected on the basis of the value showing the number of times counted by the counting circuit and the voltage outputted from the integrating circuit;
   a P/S converting circuit which receives the number of times counted by said counting circuit as an input as a parallel digital value and which serially outputs said digital value; and
   an S/P converting circuit which receives a digital value serially outputted by said P/S converting circuit as an input and which converts said digital value to a parallel digital value and outputs said parallel digital value.

2. The photoelectric detector as set forth in claim 1, further comprising: an A/D converting circuit which receives a voltage outputted from said integrating circuit and which converts said voltage into a digital value in response to said voltage and outputs said digital value.

3. The photoelectric detector as set forth in claim 1, further comprising: a V/I converting circuit which receives a voltage outputted from said integrating circuit as an input and which converts said voltage to a current in response to said voltage and outputs said current.

4. The photoelectric detector as set forth in claim 3, further comprising: an A/D converting circuit which receives a current outputted from said V/I converting circuit as an input and which converts said current into a digital value and outputs said digital value.

5. The photoelectric detector as set forth in claim 1, further comprising: a signal line for transmitting, by time sharing, a voltage outputted from said integrating circuit and a serial digital value outputted from said P/S converting circuit.

6. The photoelectric detector as set forth in claim 1, further comprising:
   a V/I converting circuit which receives a voltage outputted from said integrating circuit as an input and which converts said voltage to a current in response to said voltage and outputs said current;
   a signal line for transmitting, by time sharing, a current outputted from said V/I converting circuit and a serial digital value outputted from said P/S converting circuit.

7. The photoelectric detector as set forth in claim 1, wherein one set of said integrating circuit, comparison circuit, charge injecting circuit and counting circuit is provided with respect to a plurality of said photodiodes.

8. The photoelectric detector as set forth in claim 5, wherein said integrating circuit, comparison circuit, charge injecting circuit and counting circuit are made into one set, and only a single signal line is provided for a plurality of said sets.

* * * * *